(12) United States Patent
Ishida

(10) Patent No.: US 7,109,578 B2
(45) Date of Patent: Sep. 19, 2006

(54) SEMICONDUCTOR DEVICE AND ELECTRONIC EQUIPMENT USING THE SAME

(75) Inventor: Kaoru Ishida, Shijonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/000,204

(22) Filed: Dec. 1, 2004

(65) Prior Publication Data

US 2005/0139988 A1  Jun. 30, 2005

(30) Foreign Application Priority Data

Dec. 25, 2003  (JP) ............................. 2003-428999

(51) Int. Cl.
*H01L 23/12* (2006.01)
*H01L 23/04* (2006.01)

(52) U.S. Cl. ................ 257/700; 257/698; 257/E23.153

(58) Field of Classification Search ................ 257/700, 257/786
See application file for complete search history.

(56) References Cited

U.S. PATENT DOCUMENTS

| 5,786,630 | A * | 7/1998 | Bhansali et al. ............. 257/697 |
| 6,369,443 | B1 * | 4/2002 | Baba .......................... 257/700 |
| 6,462,522 | B1 * | 10/2002 | Burstein et al. ............ 323/282 |
| 6,639,155 | B1 * | 10/2003 | Bupp et al. ................. 174/260 |
| 2001/0050428 | A1 * | 12/2001 | Ando et al. ................. 257/700 |
| 2003/0047349 | A1 * | 3/2003 | Boireau ....................... 174/250 |

FOREIGN PATENT DOCUMENTS

| JP | 11097613 | 4/1999 |
| JP | 2003204163 | 7/2003 |

* cited by examiner

*Primary Examiner*—Evan Pert
*Assistant Examiner*—Benjamin P. Sandvik
(74) *Attorney, Agent, or Firm*—Stevens, Davis, Miller & Mosher, LLP

(57) ABSTRACT

Crosstalk is suppressed low even when one surface of a multi-layer board seats a semiconductor integrated circuit of the BGA type and peripheral circuit components. Of a plurality of BGA bumps arranged on the back surface of a semiconductor integrated circuit chip, those BGA bumps (such as a high-frequency signal pin) to which peripheral circuit components need be mounted right close are arranged outer-most, and peripheral circuit components are then mounted right close to these BGA bumps. The BGA bumps one tier inner from the outer-most BGA bumps, which are to be used as grounding terminals, are connected with a wide inner-layer grounding wire pattern. Those BGA bumps (such as a logic control signal pin) to which peripheral circuit components need not be mounted right close are disposed further inward and connected with an inner-layer wire pattern which is located even deeper down from a front layer. This makes the grounding pattern held between the signal wire pattern and the control wire pattern and ensures isolation between these wire patterns, whereby it is possible to suppress leakage of a signal which could cause crosstalk.

6 Claims, 10 Drawing Sheets

SEMICONDUCTOR DEVICE AND ELECTRONIC EQUIPMENT USING THE SAME

BACKGROUND OF THE INVENTION

1. Field of the Invention

The present invention relates to a semiconductor device which can seat a high-frequency semiconductor integrated circuit and the like at a high density and electronic equipment using such a semiconductor device.

2. Background Art

Portable electronic equipment such as a mobile telephone is equipped with diversifying functions, e.g., the equipment comprises a display of a large size so as to display images, pictures and the like, the equipment incorporates a memory card, etc. A concurrent and major shift on mobile telephones is that most of them are of the folding type. In this circumstance, a printed board needs be thinner when mounted inside. To add to the difficulty, a large-size display, a key board and the like on one surface of the printed board make it increasingly hard to mount other components on this surface of the printed board.

In connection with a high-frequency semiconductor integrated circuit used in a mobile telephone, a package of the QFP type is advantageous in requiring only fewer pins which helps size reduction, and this type of package has an improvement that the back surface of the package comprises a common plate for grounding. FIG. 10 shows a structure which uses a package of the QFP type. In FIG. 10, denoted at 1071 is a semiconductor integrated circuit chip sealed in QFP, denoted at 1072 are terminals of QFP, denoted at 1073 is a grounding plate of QFP, denoted at 1074 is a multi-layer mounting board, denoted at 1075 is a front-layer grounding pattern, denoted at 1076 are peripheral circuit components, and denoted at 1077 are through holes. As shown in FIG. 10, while the semiconductor integrated circuit chip 1071 of QFP is mounted within a chip mounting area 1071A on the front layer of the board 1074, since the grounding pattern 1075 needs be disposed on the front layer of the board 1074 in an area which corresponds to the grounding plate 1073 of the chip 1071, signal wires must be all led out from outside the pins (terminals 1072). This necessitates a void space where no component can be mounted, which is a disadvantage that the mounting area increases.

Noting this, among endeavors to reduce the size of a package, some high-frequency semiconductor integrated circuits for use in mobile telephone have started to use a chip size package (CSP) of the ball grid array (BGA) type instead of a package of the QFP type, for the purpose of reducing the mounting area. A package of this type achieves a small mounting area, as external peripheral components are mounted on the both surfaces of a mounting board as shown in FIG. 8. In FIG. 8, denoted at 861 is a semiconductor integrated circuit chip, denoted at 862 is a multi-layer mounting board, denoted at 863 are peripheral circuit components to be mounted on a front layer, and denoted at 864 are peripheral circuit components to be mounted on a back layer. With the peripheral circuit components 864 mounted on the back side of the mounting surface of the semiconductor integrated circuit 861 within the back layer, it is possible to realize mounting that the wires are short and less intersect with other wires (See Japanese Patent Application Laid-Open Gazette No. 2003-204163 and Japanese Patent Gazette No. 3507300.)

However, even in the case of a CSP of the BGA type described above, it is becoming difficult to mount other components on one surface as explained earlier. Owing to this, as shown in FIG. 9, where a key board 966 is disposed on the back surface and mounting on the both surfaces is therefore impossible, it is necessary to mount the components 965, which used to be mounted on the back surface (and which correspond to 864 shown in FIG. 8), to wires which have been pulled up to the front layer using interconnections, through holes, etc. This complicates signal wires, leading to inconveniences and problems such as crosstalk.

SUMMARY OF THE INVENTION

An object of the present invention is to provide a semiconductor device which suppresses crosstalk even when one surface of a multi-layer board seats a semiconductor integrated circuit of the BGA type and peripheral circuit components, and electronic equipment using such a semiconductor device.

To achieve the object, a semiconductor device according to the first invention is a semiconductor device in which a semiconductor integrated circuit chip, which comprises a plurality of ball grid array terminals disposed in a lattice arrangement in one surface, and a plurality of peripheral circuit components are mounted on a multi-layer board which comprises a plurality of front-layer wire patterns, which are formed in one surface and connected with the ball grid array terminals and terminals of the peripheral circuit components, and a plurality layers of inner-layer wire patterns, wherein the plurality of ball grid array terminals of the semiconductor integrated circuit chip which are disposed in a lattice arrangement include at least one first non-grounding ball grid array terminal disposed outer-most in the lattice arrangement, at least one first grounding ball grid array terminal disposed on the inner side to the first non-grounding ball grid array terminal, and at least one second non-grounding ball grid array terminal disposed on the inner side to the first grounding ball grid array terminal, the plurality layers of inner-layer wire patterns of the multi-layer board include at least one inner-layer grounding wire pattern and at least one inner-layer non-grounding wire pattern which is formed at least one layer below the inner-layer grounding wire pattern from the front layer, the first one of the front-layer wire patterns which is connected with the first non-grounding ball grid array terminal is connected with the terminal of the first one of the peripheral circuit components which is disposed right close to the semiconductor integrated circuit chip, the second one of the front-layer wire patterns which is connected with the first grounding ball grid array terminal is connected with the inner-layer grounding wire pattern via a first through hole, the third one of the front-layer wire patterns which is connected with the second non-grounding ball grid array terminal is connected with one end of the inner-layer non-grounding wire pattern via a second through hole, and the fourth one of the front-layer wire patterns which is connected with the terminal of the second one of the peripheral circuit components not located right close to the semiconductor integrated circuit chip is connected with the other end of the inner-layer non-grounding wire pattern via a third through hole.

In the semiconductor device according to the present invention, those BGA terminals to which the peripheral circuit components need be mounted right close are arranged outer-most and connected with the immediately near peripheral circuit components by the front-layer wire pattern of the multi-layer board, the BGA terminals on the inner side to be used as grounding terminals are connected with the inner-layer grounding wire pattern of the multi-layer board, and those BGA terminals to which the peripheral circuit components need not be mounted right close are arranged further inward and connected with the inner-layer non-grounding wire pattern which is in the inner layer which is even deeper from the front layer. This makes the inner-layer grounding wire pattern held between the front-layer wire pattern and the inner-layer non-grounding wire pattern which may be a control wire and ensures isolation between these wire patterns, whereby it is possible to suppress leakage of a signal which could cause crosstalk. It is thus possible to realize high-density mounting even on one surface of a mounting board in a CSP of the BGA type and suppress crosstalk low.

A semiconductor device according to the second invention is the semiconductor device according to the first invention, wherein the plurality of ball grid array terminals of the semiconductor integrated circuit chip which are disposed in a lattice arrangement include at least one second grounding ball grid array terminal disposed outer-most in the lattice arrangement, and the fifth one of the front-layer wire patterns which is connected with the second grounding ball grid array terminal is connected with the inner-layer grounding wire pattern via a fourth through hole.

A semiconductor device according to the third invention is the semiconductor device according to the first invention, wherein there are two or more such grounding ball grid array terminals, and the two or more grounding ball grid array terminals are linearly arranged.

A semiconductor device according to the fourth invention is the semiconductor device according to the first invention, wherein there are three or more such grounding ball grid array terminals, and the three or more grounding ball grid array terminals are disposed in an L-shaped arrangement.

A semiconductor device according to the fifth invention is the semiconductor device according to the first invention, wherein the grounding ball grid array terminals are disposed in the shape of a rectangle which misses one side.

A semiconductor device according to the sixth invention is the semiconductor device according to the first invention, wherein the grounding ball grid array terminals are disposed in a loop-like arrangement.

A semiconductor device according to the seventh invention is the semiconductor device according to the first or the second invention, wherein all of the through holes are through holes which do not penetrate through the multi-layer board.

A semiconductor device according to the eighth invention is the semiconductor device according to the first or the second invention, wherein all of the through holes are through holes which penetrate through the multi-layer board.

Electronic equipment according to the ninth invention is electronic equipment comprising a semiconductor integrated circuit, a high-frequency transmit/receive circuit, a control processing part, a display part, an input part, a storage medium part and a battery, wherein the semiconductor integrated circuit is comprised of the semiconductor integrated circuit chip of the semiconductor device of claim 1, the high-frequency transmit/receive circuit is comprised of the first one of the peripheral circuit components of the semiconductor device and the control processing part is comprised of the second one of the peripheral circuit components of the semiconductor device so that the semiconductor integrated circuit, the high-frequency transmit/receive circuit and the control processing part are comprised of the semiconductor device, and the back surface of the multi-layer board of the semiconductor device seats at least one of the display part, the input part, the storage medium part and the battery.

Electronic equipment formed using the semiconductor device according to the present invention attains a similar effect.

DETAILED DESCRIPTION OF THE PREFERRED EMBODIMENTS

Embodiments of the present invention will now be described with reference to the associated drawings.

(First Embodiment)

Figure 1:
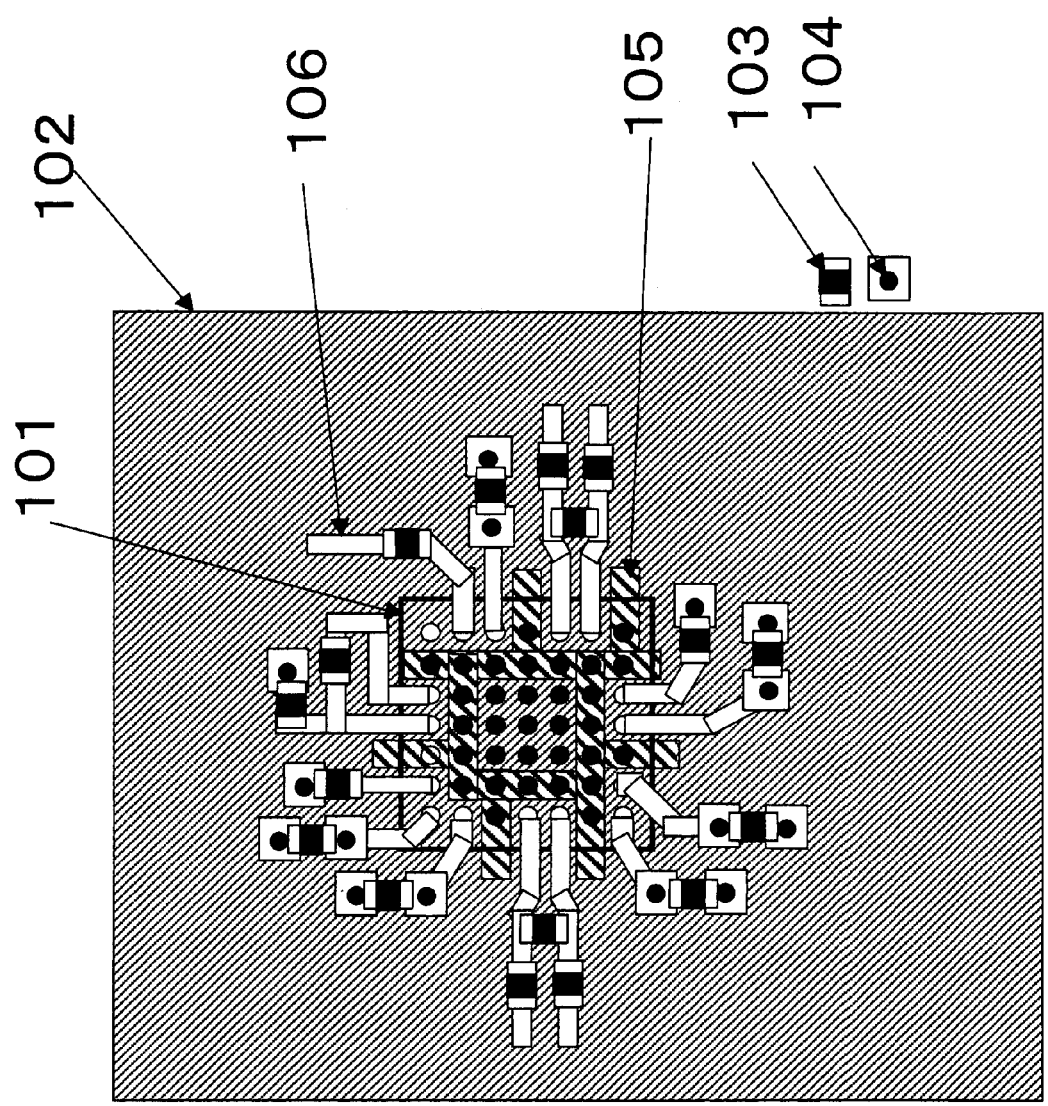
FIG. 1 is a top view of a semiconductor device according to a first embodiment of the present invention.
Figure 2:
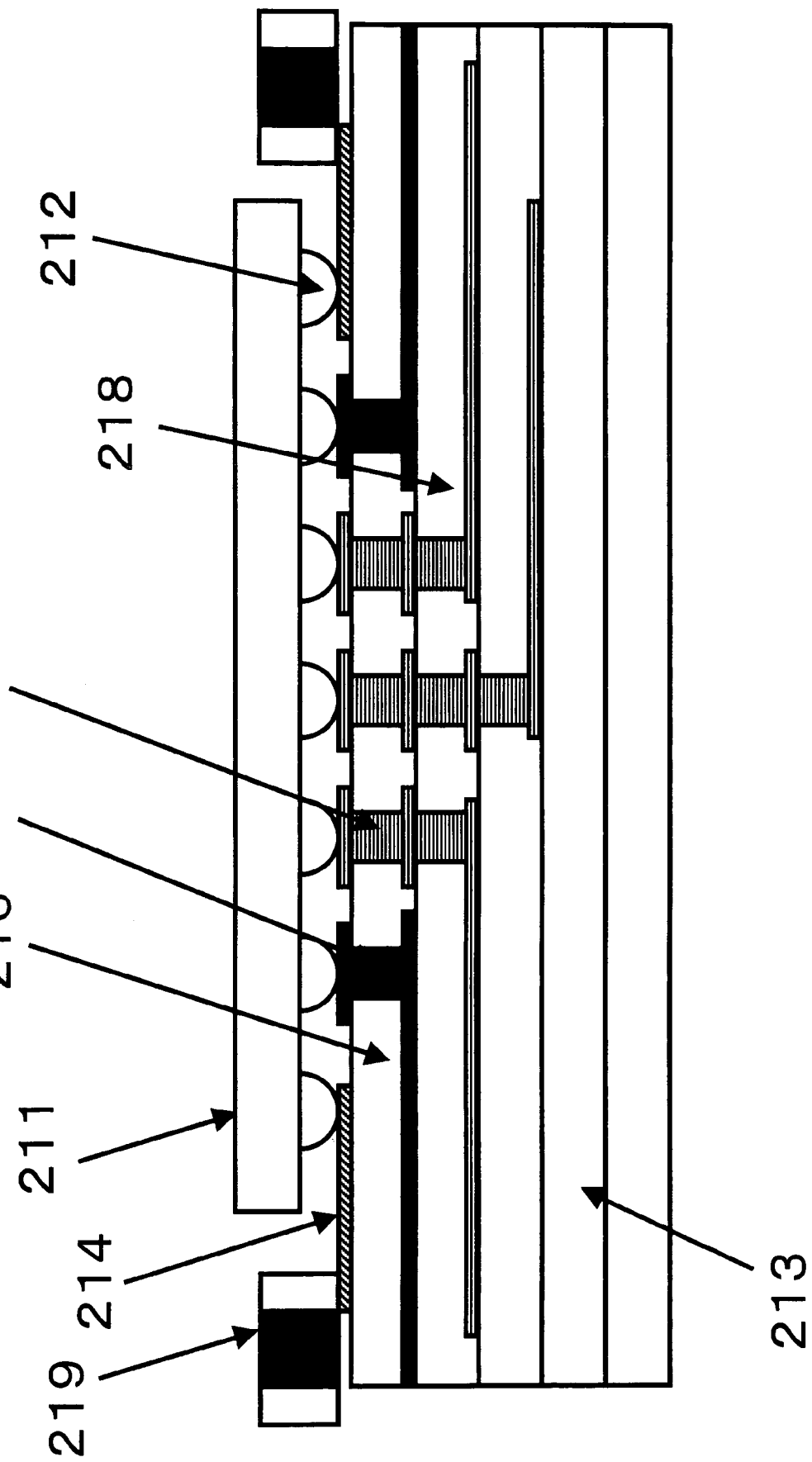
FIG. 2 is a cross sectional view of the semiconductor device according to the first embodiment of the present invention.
Figure 3:
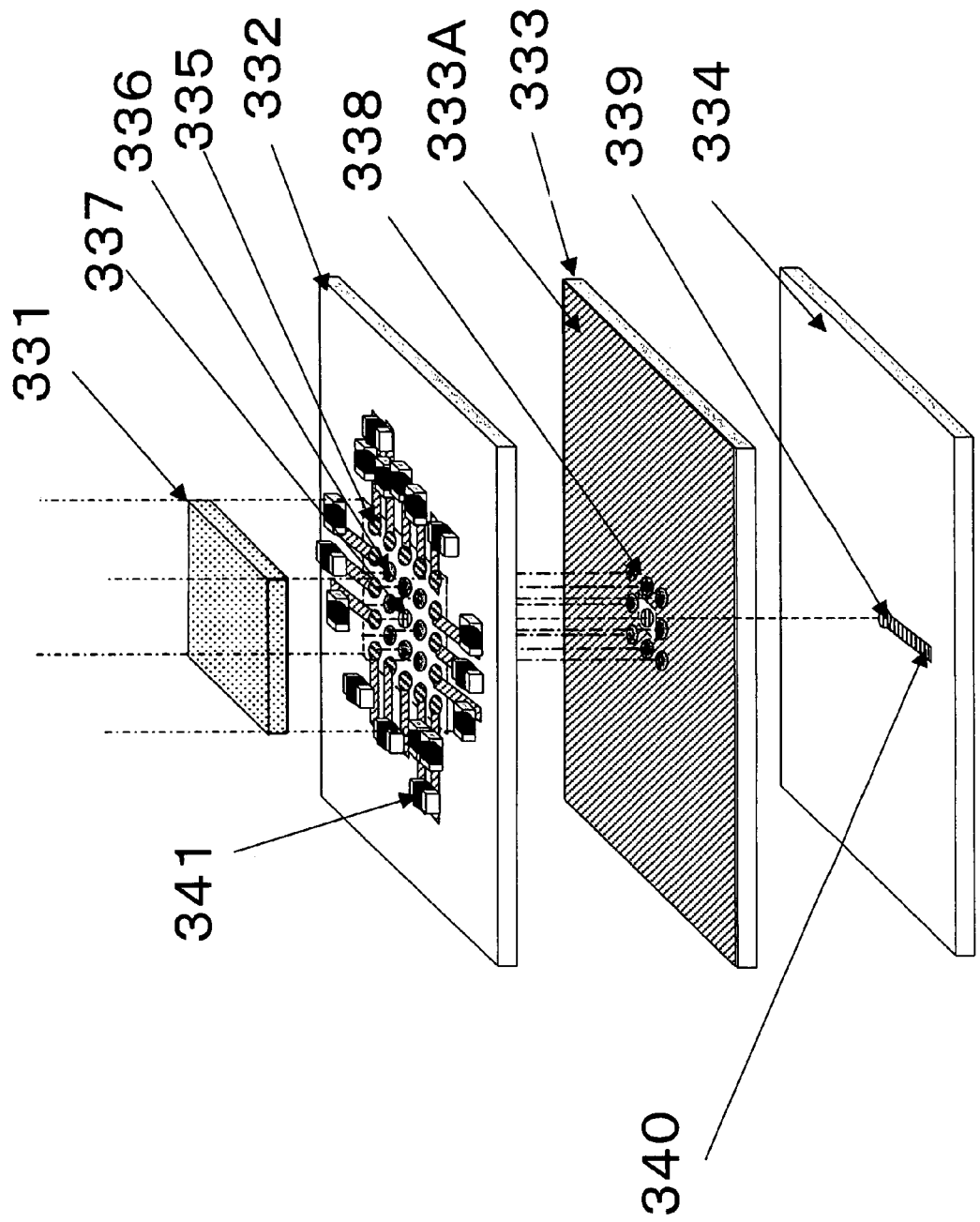
FIG. 3 is an exploded perspective view of the semiconductor device according to the first embodiment of the present invention.

The first embodiment of the present invention will be described first with reference to FIGS. 1, 2 and 3. FIG. 1 is a top view of a semiconductor device according to the first embodiment of the present invention. In FIG. 1, denoted at 101 is a semiconductor integrated circuit chip processed as a CSP of the BGA type, denoted at 102 is a multi-layer board, denoted at 103 are peripheral circuit components (first peripheral circuit components), denoted at 104 are through holes, denoted at 105 is a grounding pattern formed in a front layer, and denoted at 106 is a wire pattern (first front-layer wire pattern) other than the ground formed in the front layer. FIG. 2 is a cross sectional view of the semiconductor device according to the first embodiment of the present invention. In FIG. 2, denoted at 211 is the semiconductor integrated circuit chip processed as a CSP of the BGA type (101 in FIG. 1), denoted at 212 are BGA bumps, denoted at 213 is the multi-layer board (102 in FIG. 1), denoted at 214 is the wire pattern in the front surface (106 in FIG. 1), denoted at 215 are the non-penetrating through holes for grounding (first through holes), denoted at 216 is a grounding wire pattern in an inner layer (inner-layer grounding wire pattern), denoted at 217 are non-penetrating through holes for signal wires (second through holes), denoted at 218 is a signal wire pattern in an inner layer (inner-layer non-grounding wire pattern), and denoted at 219 are the peripheral circuit components (103 in FIG. 1). FIG. 3 is an exploded perspective view of the semiconductor device according to the first embodiment of the present invention. In FIG. 3, denoted at 331 is the semiconductor integrated circuit chip processed as a CSP of the BGA type (101 in FIG. 1), denoted at 332 is a wire in the front surface of the multi-layer mounting board and a first dielectric layer, denoted at 333 is a wire in a first inner layer of the multi-layer mounting board and a second dielectric layer, denoted at 334 is a wire in a second inner layer of the multi-layer mounting board and a third dielectric layer, denoted at 335 is an outer-most signal terminal pattern, denoted at 336 is a grounding terminal pattern (second front-layer wire pattern), denoted at 337 is a control signal terminal pattern (third front-layer wire pattern), denoted at 338 is an inner-layer grounding pattern which is connected by a non-penetrating through hole with the grounding terminal pattern 336, denoted at 339 is an inner-layer pattern which is connected by a non-penetrating through hole with the control signal terminal pattern 337, denoted at 340 is the inner-layer control signal pattern (218 in FIG. 2), and denoted at 341 are the peripheral circuit components (103 in FIG. 1). The shaded portion 333A within the surface of 333 in FIG. 3 (the wire in the first inner layer of the multi-layer mounting board and the second dielectric layer) except for a central section is the grounding wire pattern 216 shown in FIG. 2, while the circular inner-layer grounding pattern 338 is a part of the shaded portion 333A. The grounding terminal pattern 336 is the grounding pattern 105 formed in the front layer which may become for example a pattern formed within an area which is connected with the BGA bumps 212, or alternatively, a wire pattern further led out from the area which is connected with the BGA bumps 212 in the event that a grounding through hole for instance cannot be located immediately below an IC. The outer-most signal terminal pattern 335 is the wire pattern 106 formed in the front layer (214 in FIG. 2).

Among the through holes penetrating the respective dielectric layers, those that do not penetrate through all layers of the multi-layer mounting board are non-penetrating through holes. Those that penetrate through all layers of the multi-layer mounting board are non-penetrating through holes (second embodiment). For example, the through holes penetrating the respective dielectric layers shown in FIG. 2 (215, 217, etc.) are all non-penetrating through holes. The number and arrangement of the peripheral circuit components, the wires in the front surface of the multi-layer mounting board, the terminal patterns, the inner-layer wires, and the like as they are shown in FIGS. 1, 2 and 3 do not perfectly correspond to each other between FIGS. 1, 2 and 3. In FIGS. 1, 2 and 3, this embodiment described below is illustrated simple to the extent that the basic structure according to the embodiment will be understood.

In this embodiment, of the plurality of BGA bumps 212 arranged like a lattice on the back surface of the semiconductor integrated circuit chip 211, those BGA bumps 212 which are required to be right close to the peripheral circuit components 219 (i.e., a high-frequency signal pin, a power source pin, etc.) are located outermost, and the peripheral circuit components (a high-frequency matching circuit, a bypass capacitor, etc.) are mounted right close to the BGA bumps 212 for prevention of deterioration in characteristics. To use the BGA bumps 212 that are one tier inner as grounding terminals, these BGA bumps 212 are connected with the grounding pattern 216, which is wide in the inner layer of the multi-layer mounting board 213, via the non-penetrating through holes 215, and further, the BGA bumps 212 to which peripheral circuit components need not be mounted right close (e.g., a logic control signal pin) are further disposed inside the BGA bumps 212 above and connected with the wire pattern 218 (340), which is in the inner layer which is deeper from the front layer, via the non-penetrating through holes 217. This makes the grounding pattern 216 held between the signal wire pattern 214 and the control wire pattern 218 and ensures isolation between these wire patterns, whereby it is possible to suppress leakage of a signal which could cause crosstalk, and cross talk is suppressed.

Figure 8:
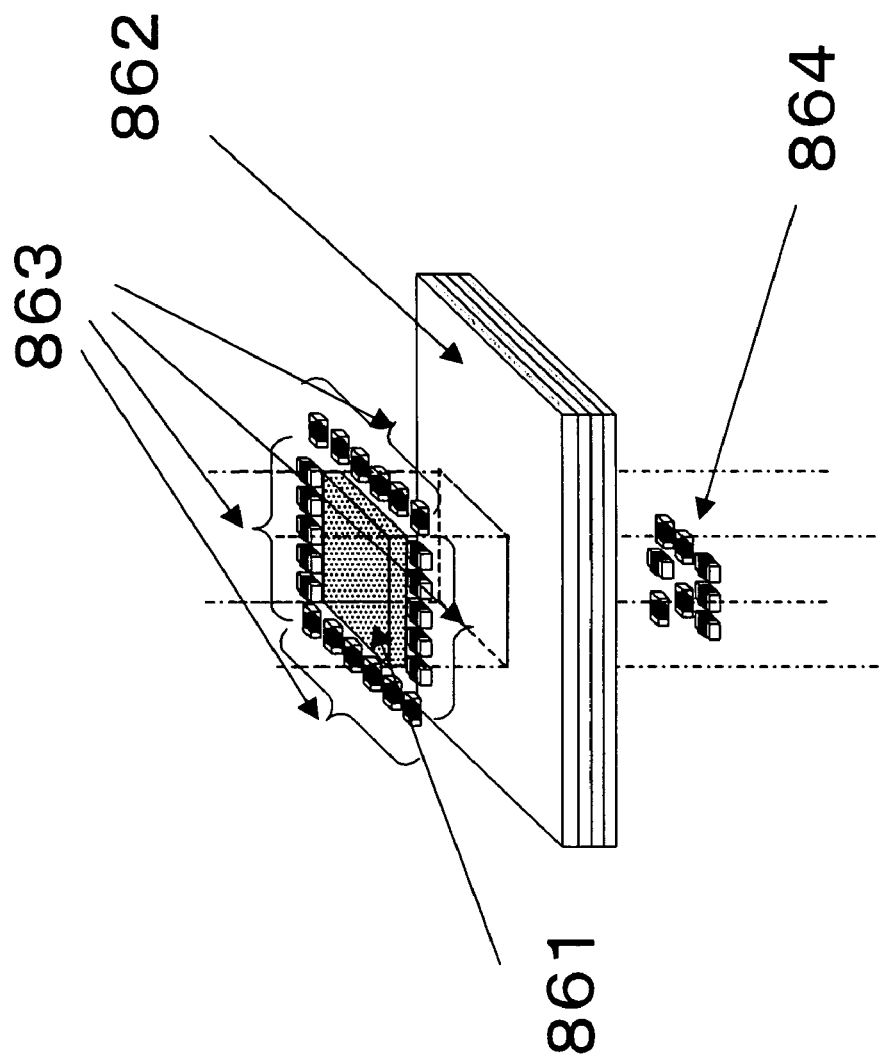
FIG. 8 is a perspective view of a conventional semiconductor device of the BGA type whose both sides provide mounting.
Figure 9:
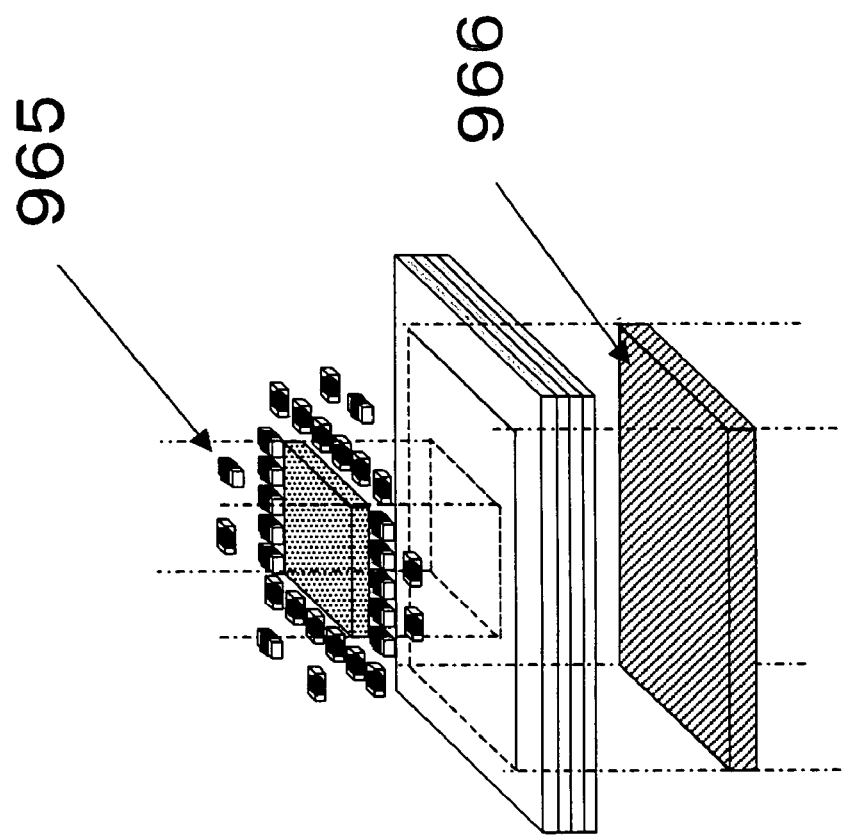
FIG. 9 is a perspective view of a conventional semiconductor device of the BGA type whose one surface provides mounting.
Figure 10B:
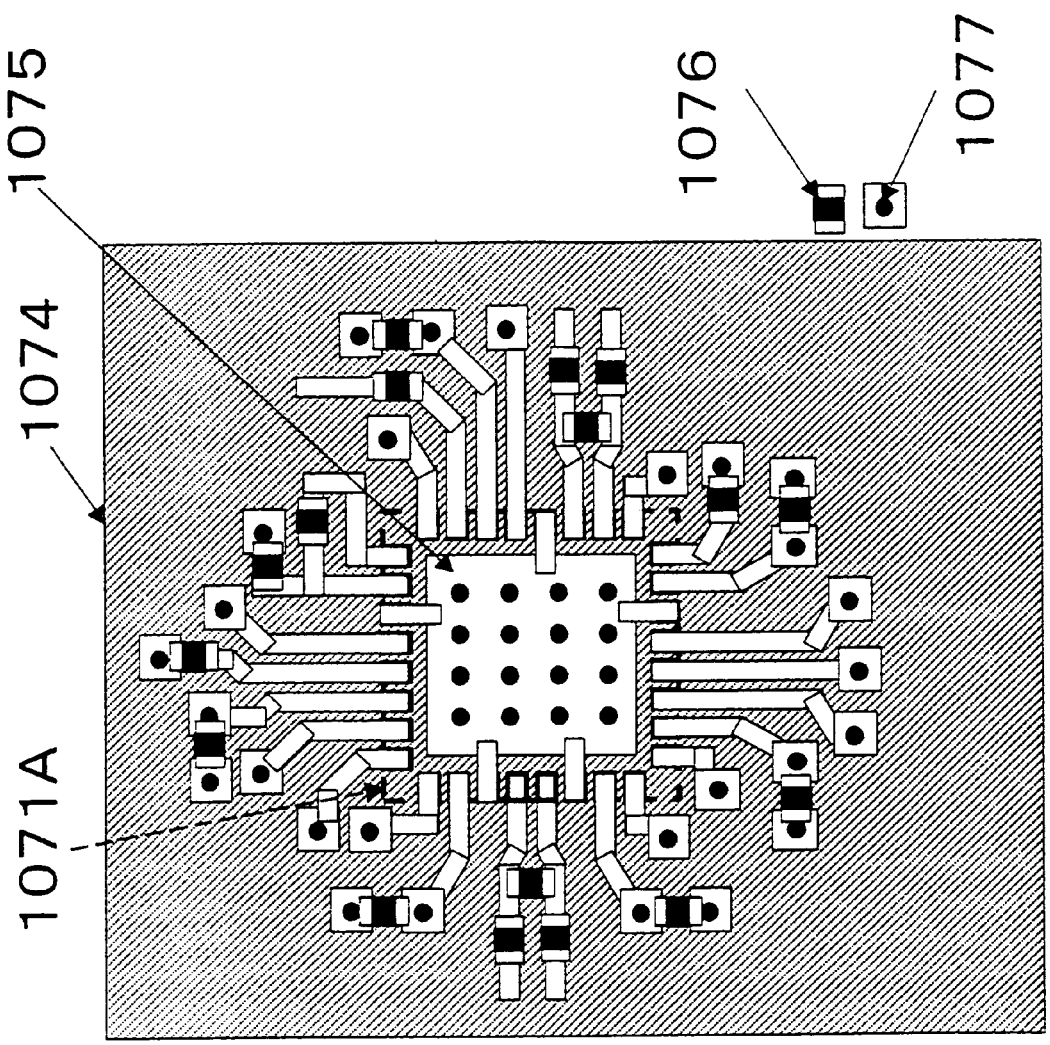
FIG. 10 is a plan view of a conventional semiconductor device of the QFP type.
Figure 10A:
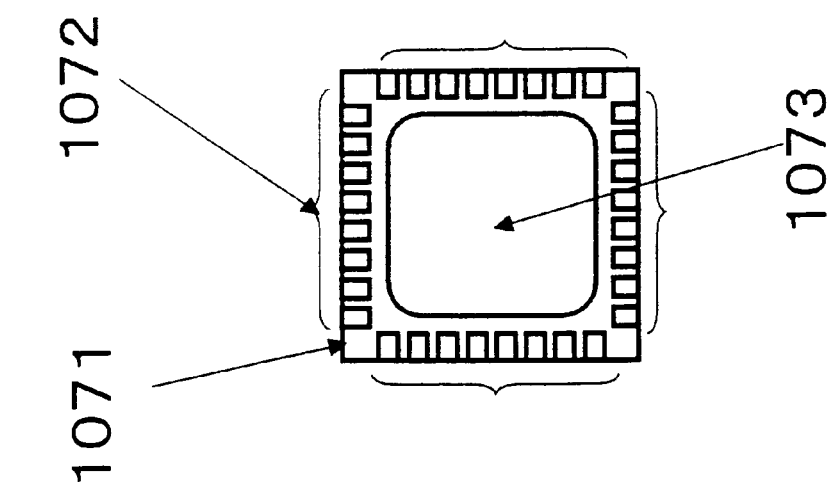

Although not shown in FIG. 2, the control wire pattern 218 (340) is connected with the peripheral circuit components (second peripheral circuit components) which need not be mounted right close to the BGA bumps 212, via the non-penetrating through holes (third through holes) which are formed on the control wire pattern 218 and a front-layer wire pattern (fourth front-layer wire pattern). The peripheral circuit components which need not be mounted right close to the BGA bumps 212 correspond to the peripheral circuit components 864 which in FIG. 8 are mounted on the back surface of the multi-layer mounting board. The inner-layer grounding wire pattern 216 (333A) is formed avoiding the non-penetrating through holes which are connected with the grounding terminals, the terminals other than wire pattern, the wire patterns (control wire pattern 218, 337, etc.) and the like as denoted at 333A in FIG. 3, such that the grounding wire pattern 216 (333A) is not connected with the grounding terminals, the terminals other than wire pattern, the wire patterns (control wire pattern 218, 337, etc.) and the like. Thus, the inner-layer grounding wire pattern 216 (333A) is formed almost all over the surface of the second dielectric layer (a part of 333), except for these non-penetrating through holes and areas around these non-penetrating through holes, (Second Embodiment)

Figure 4:
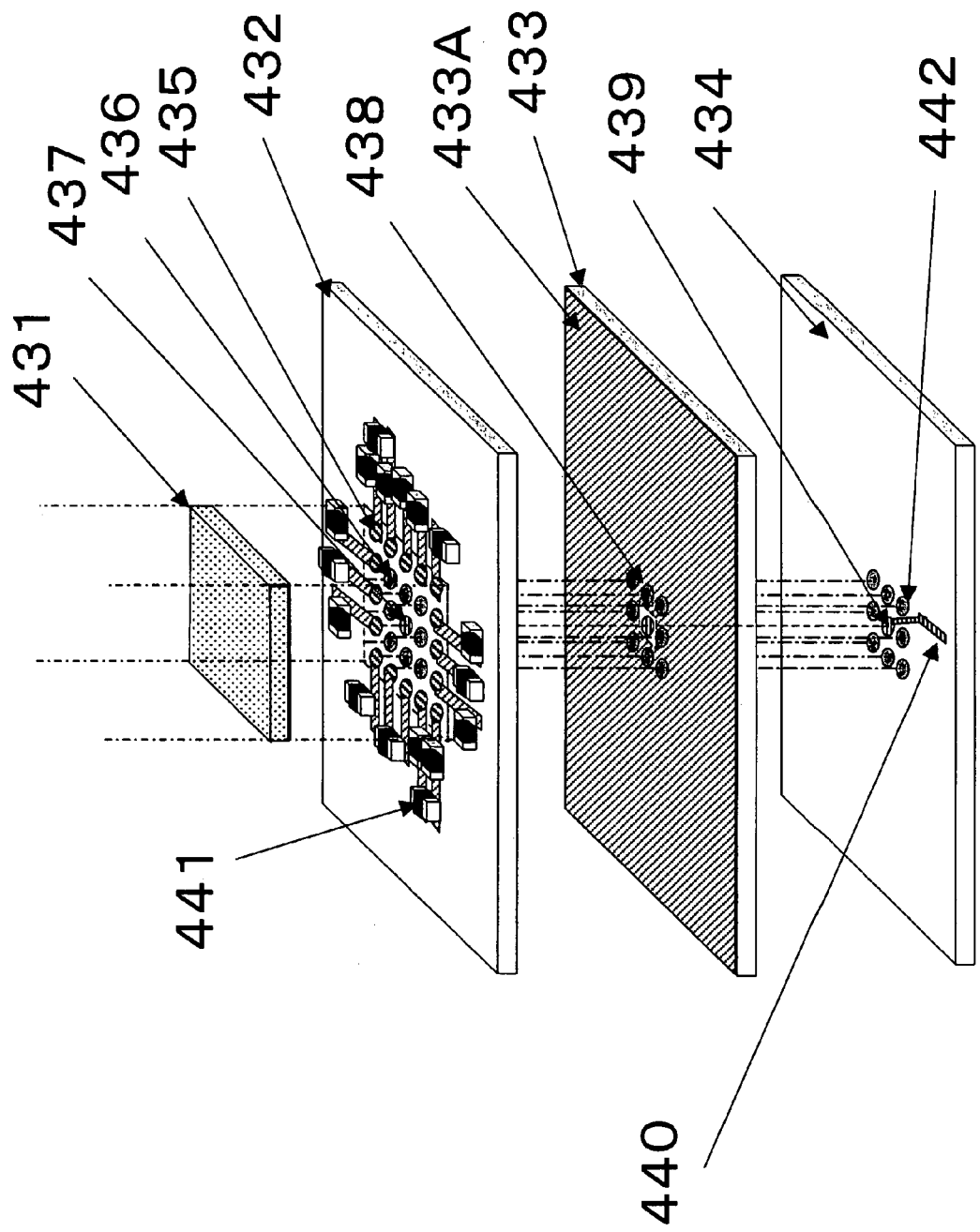
FIG. 4 is an exploded perspective view of the semiconductor device according to a second embodiment of the present invention.
Figure 5:
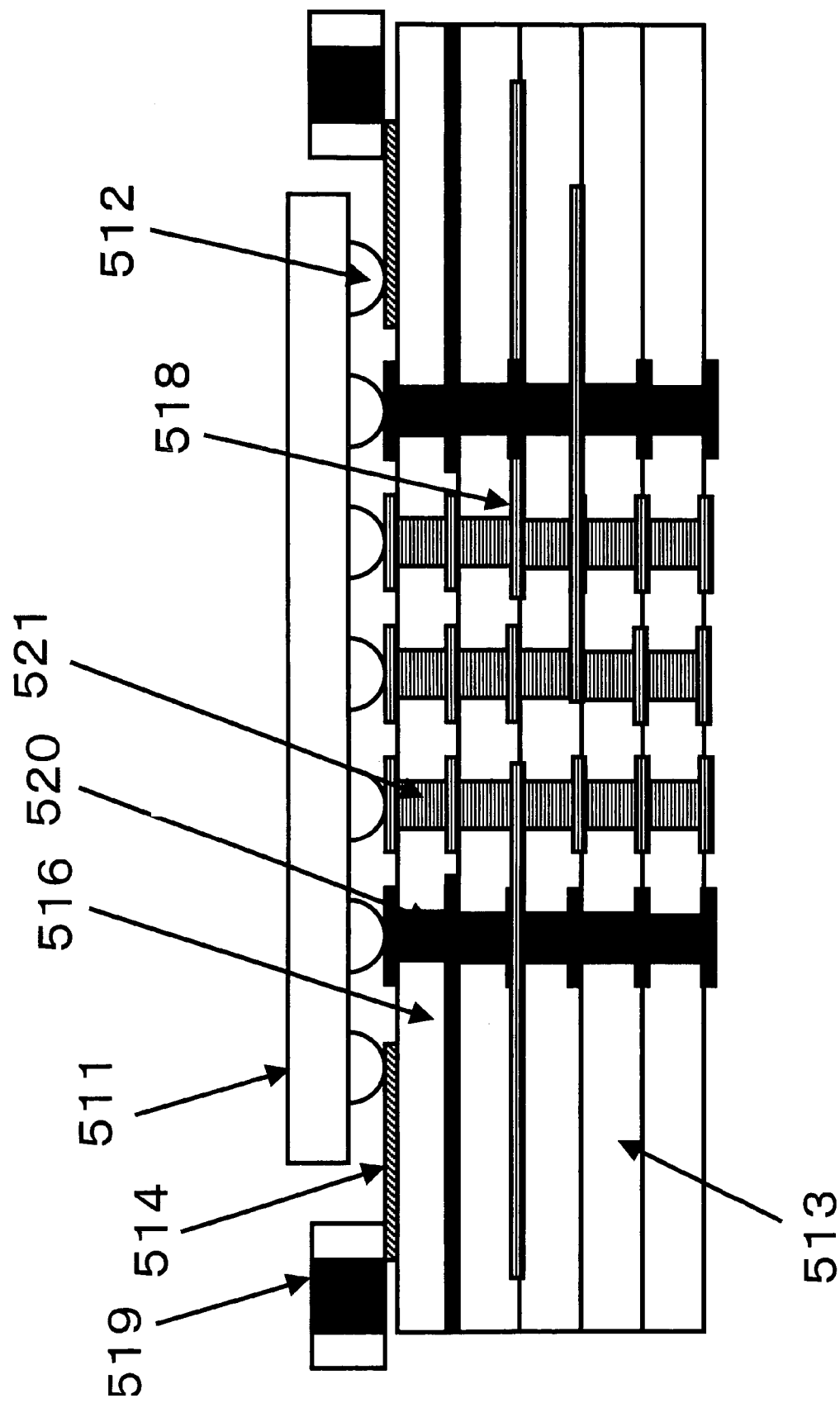
FIG. 5 is a cross sectional view of the semiconductor device according to the second embodiment of the present invention.

The second embodiment of the present invention will now be described with reference to FIGS. 4 and 5. FIG. 4 is an exploded perspective view of the semiconductor device according to the second embodiment of the present invention. In FIG. 4, the portions which are the same as those shown in FIG. 3 are denoted at reference numbers whose lower two digits are the same as those used in FIG. 3, but will not be described. Denoted at 442 is a second inner-layer grounding pattern obtained as grounding terminal patterns 436 are connected with a first inner-layer grounding pattern 438 by non-penetrating through holes. FIG. 5 is a cross sectional view of the semiconductor device according to the second embodiment of the present invention. In FIG. 5, the portions which are the same as those shown in FIG. 2 are denoted at reference numbers whose lower two digits are the same as those used in FIG. 2, but will not be described. Denoted at 520 are non-penetrating through holes for grounding, while denoted at 521 are non-penetrating through holes for signal wires. A top view of the semiconductor device according to the second embodiment of the present invention is similar to FIG. 1.

The only difference of the second embodiment from the first embodiment is that the non-penetrating through holes in the multi-layer board are replaced with non-penetrating through holes. Even in this case, with the inner-layer signal pattern 440 disposed avoiding the second inner-layer grounding pattern 442 as shown in FIG. 4, a similar effect to that according to the first embodiment is attained.

Figure 6:
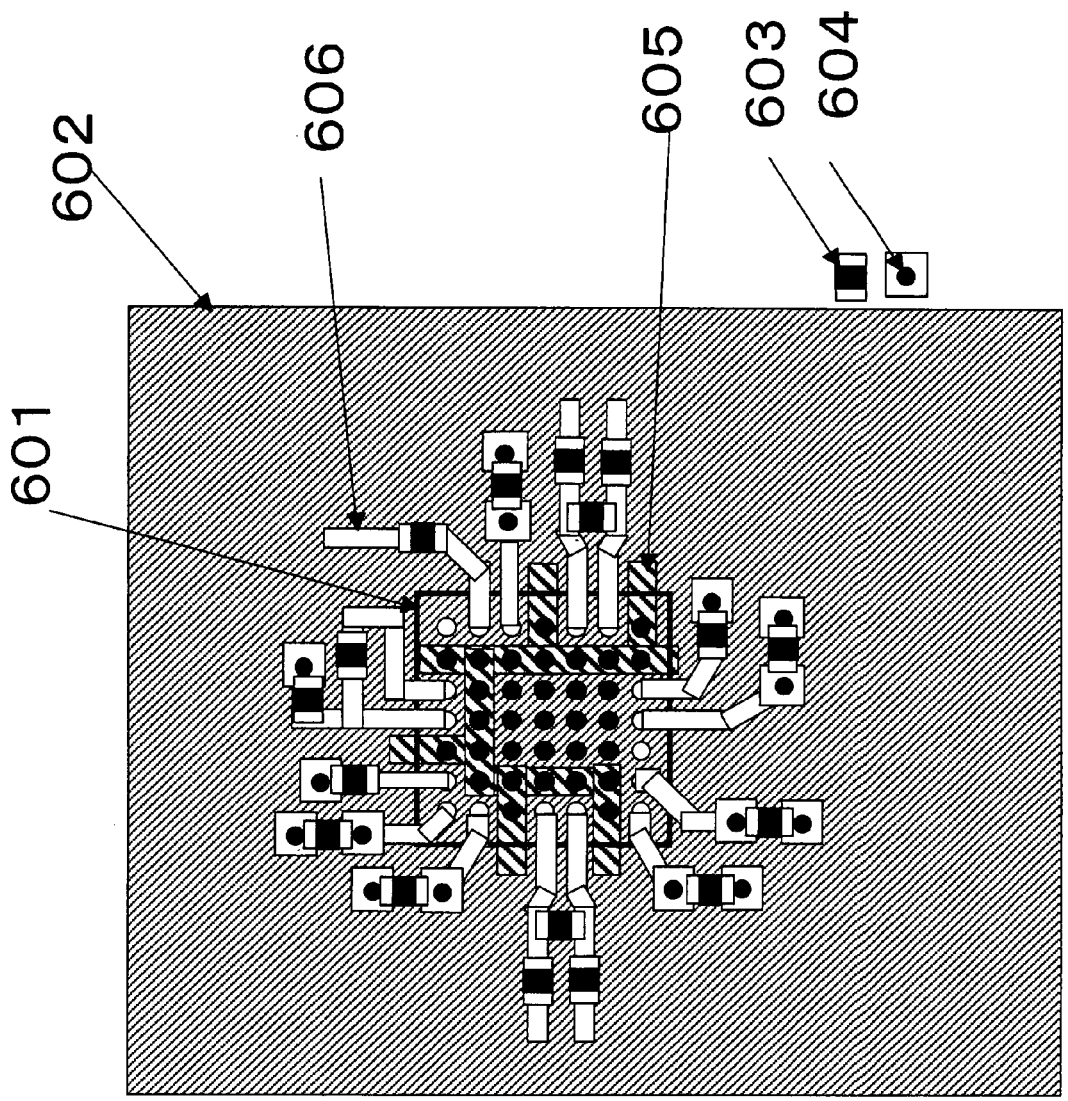
FIG. 6 is a top view which shows other example of the semiconductor devices according to the first and the second embodiments of the present invention.

While the foregoing has described that the front-layer grounding pattern 105 is shaped like a loop according to the first and the second embodiments, depending upon the number and arrangement of a high-frequency signal pin, a power source pin and others, the front-layer grounding pattern 105 may define together with logic control pins the shape of a rectangle which misses one side, a shape like parallel bars, an L-shape or a shape like a straight line as shown in FIG. 6 (In FIG. 6, the portions which are the same as those shown in FIG. 1 are denoted at reference numbers whose lower two digits are the same as those used in FIG. 1, but will not be described.), even in which case a similar effect is clearly attained.

In the event that it is not necessary to mount peripheral circuit components right close to such terminals (BGA bumps) which require peripheral circuit components, the peripheral circuit components may be disposed to control terminals pins which are on the inner side instead of outermost terminals, thereby attaining a similar effect.

Further, although the foregoing has described that the grounding terminals are one tier inner than the outer-most ones, the grounding terminals may be disposed outermost or alternatively also to the inner-side pins, which modification and other modifications to the extent not deviating from the basic concept of the present invention clearly attain a similar effect.

(Third Embodiment)

Figure 7:
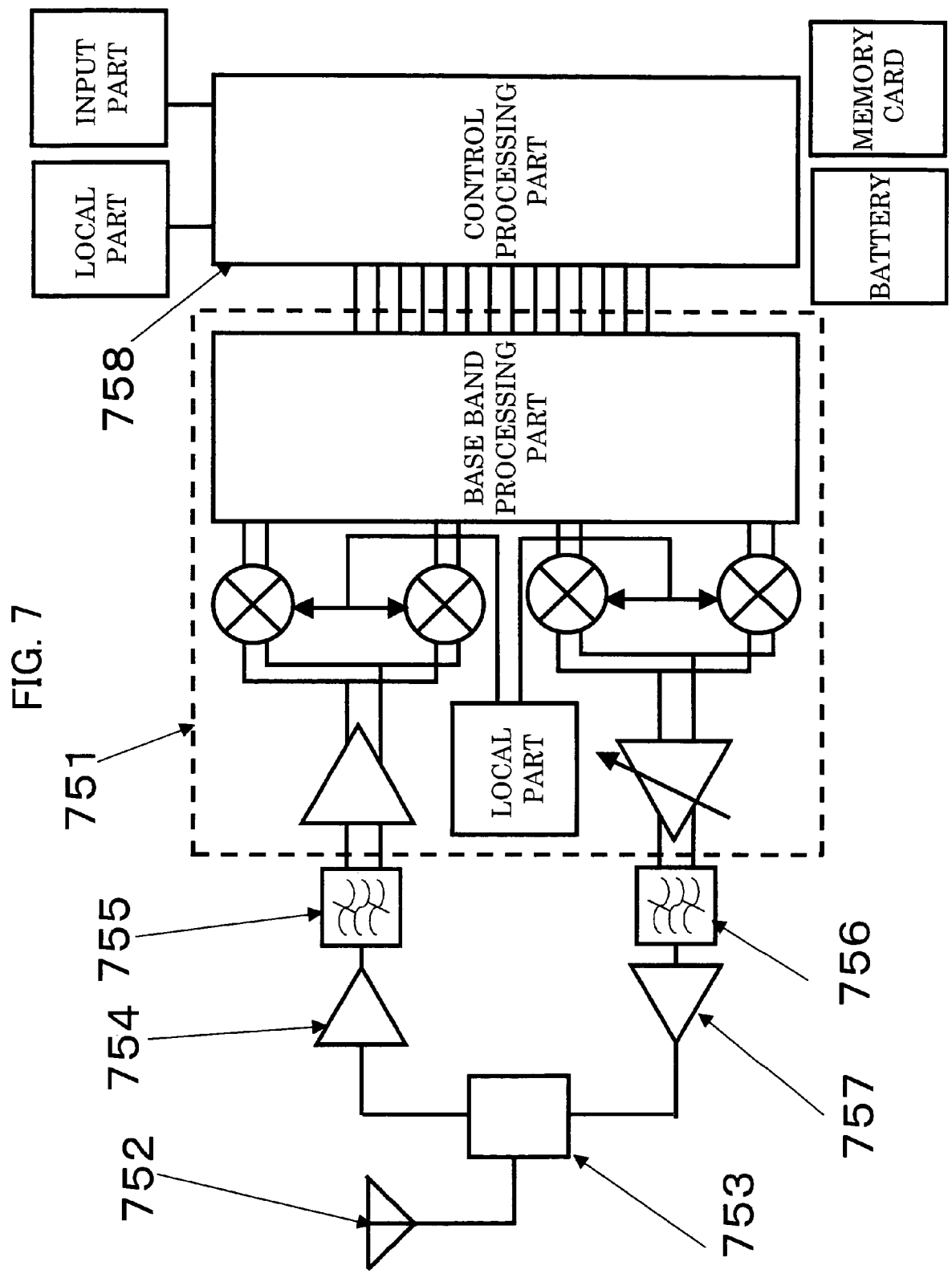
FIG. 7 is a block diagram of electronic equipment according to a third embodiment of the present invention.

The third embodiment of the present invention will now be described with reference to FIG. 7. FIG. 7 is a block diagram of portable telecommunication equipment which is one example of electronic equipment according to the third embodiment of the present invention. In FIG. 7, denoted at 751 is a semiconductor integrated circuit, denoted at 752 is an antenna, denoted at 753 is an antenna duplexer, denoted at 754 is a receive amplifier, denoted at 755 is a receive filter, denoted at 756 is a transmit filter, denoted at 757 is a transmit amplifier, and denoted at 758 is a control processing part. The semiconductor integrated circuit 751 receives a signal from the receive filter 755, outputs a signal to the transmit filter 756, and transfers a signal with the control processing part 758. The control processing part 758 receives a signal from an input part, outputs a signal to a display part, and handles data with the semiconductor integrated circuit 751.

The semiconductor integrated circuit 751 comprises a logic control signal terminal which is for connection with the control processing part 758 and terminals including a signal transmit/receive terminal and a power source terminal to which peripheral circuit components need be mounted right close. Further, the back surface of the multi-layer mounting board does not have any space to seat components, since there already are the display part, the input part including a key board, a memory card which serves as a storage medium part, a battery, etc. Therefore, the semiconductor integrated circuit 751 is mounted as a semiconductor integrated circuit chip in a structure as those described in relation to the first and the second embodiments, and the antenna duplexer 753, the receive amplifier 754, the receive filter 755, the transmit filter 756 and the transmit amplifier 757 which form a high-frequency transmit/receive circuit are mounted on the same surface of the multi-layer board as the peripheral circuit components which need be mounted right close to the BGA bumps of the semiconductor integrated circuit chip, which realizes a high-density wireless block of the portable telecommunication equipment. Further, since this suppresses leakage of a high-frequency signal to a logic wire, it is possible to prevent malfunction such as crosstalk. The control processing part 758 is mounted on the same mounting surface of the multi-layer board which seats the semiconductor integrated circuit chip, as a peripheral circuit component which needs not be mounted right close to the BGA bumps of the semiconductor integrated circuit chip.

Described as the semiconductor integrated circuit 751 in relation to this embodiment is merely one example. It is clear that the same effect is attained by means of the same structure of the BGA type comprising both a logic control signal terminal and those terminals including signal terminals and a power source terminal to which peripheral circuit components need be mounted right close.

The invention claimed is:

1. A semiconductor device in which a high frequency use semiconductor integrated circuit chip, which comprises a plurality of ball grid array terminals disposed in a lattice arrangement in one surface, and a plurality of peripheral circuit components are mounted on a multi-layer board which comprises a plurality of front-layer wire patterns, which are formed in one surface and connected with said ball grid array terminals and terminals of said peripheral circuit components, and a plurality layers of inner-layer wire patterns, wherein:

said plurality of ball grid array terminals of said high frequency use semiconductor integrated circuit chip which are disposed in a lattice arrangement include at least one first non-grounding ball grid array terminal disposed outer-most in the lattice arrangement, at least one first grounding ball grid array terminal disposed on the inner side to said first non-grounding ball grid array terminal, and at least one second non-grounding ball grid array terminal disposed on the inner side to said first grounding ball grid array terminal, said first non-grounding ball grid array terminal is a high-frequency signal terminal and/or a power supply terminal while said second non-grounding ball grid array terminal is a logic control terminal, said plurality layers of inner-layer wire patterns of said multilayer board include at least one inner-layer grounding wire pattern and at least one inner-layer non-grounding wire pattern which is formed at least one layer below said inner-layer grounding wire pattern from said front layer, the first one of said front-layer wire patterns which is connected with said first non-grounding ball grid array terminal is connected with the terminal of the first one of said peripheral circuit components which is disposed right close to said semiconductor integrated circuit chip, the second one of said front-layer wire patterns which is connected with said first grounding ball grid array terminal is connected with said inner-layer grounding wire pattern via a first through hole, the third one of said front-layer wire patterns which is connected with said second non-grounding ball grid array terminal is connected with one end of said inner-layer non-grounding wire pattern via a second through hole, and the fourth one of said front-layer wire patterns which is connected with the terminal of the second one of said peripheral circuit components not located right close to said semiconductor integrated circuit chip is connected with the other end of said inner-layer non-grounding wire pattern via a third through hole.

2. The semiconductor device of claim 1, wherein there are two or more such grounding ball grid array terminals, and said two or more grounding ball grid array terminals are linearly arranged.

3. The semiconductor device of claim 1, wherein there are three or more such grounding ball grid array terminals, and
said three or more grounding ball grid array terminals are disposed in an L-shaped arrangement.

4. The semiconductor device of claim 1, wherein said grounding ball grid array terminals are disposed in the shape of a rectangle which misses one side.

5. The semiconductor device of claim 1, wherein said grounding ball grid array terminals are disposed in a loop-like arrangement.

6. Electronic equipment comprising a semiconductor integrated circuit, a high-frequency transmit/receive circuit, a control processing part, a display part, an input part, a storage medium part and a battery, wherein
said semiconductor integrated circuit is comprised of said semiconductor integrated circuit chip of the semiconductor device of claim 1, said high-frequency transmit/receive circuit is comprised of the first one of said peripheral circuit components of the semiconductor device and said control processing part is comprised of the second one of said peripheral circuit components of the semiconductor device so that said semiconductor integrated circuit, said high-frequency transmit/receive circuit and said control processing part are comprised of said semiconductor device, and
the back surface of said multi-layer board of said semiconductor device seats at least one of said display part, said input part, said storage medium part and said battery.

* * * * *